(12) United States Patent
Ben-David et al.

(10) Patent No.: US 7,146,301 B2
(45) Date of Patent: Dec. 5, 2006

(54) EFFICIENT PRODUCTION OF DISJOINT MULTIPLE TRACES

(75) Inventors: Shoham Ben-David, Haifa (IL); Anna Gringauze, Haifa (IL)

(73) Assignee: International Business Machines Corporation, Armonk, NY (US)

( * ) Notice: Subject to any disclaimer, the term of this patent is extended or adjusted under 35 U.S.C. 154(b) by 875 days.

(21) Appl. No.: 10/042,304

(22) Filed: Jan. 11, 2002

(65) Prior Publication Data

US 2002/0193974 A1 Dec. 19, 2002

Related U.S. Application Data

(60) Provisional application No. 60/261,550, filed on Jan. 12, 2001.

(51) Int. Cl.
*G06F 17/50* (2006.01)
(52) U.S. Cl. .................. 703/14; 703/2; 716/4; 714/25
(58) Field of Classification Search .................. 703/14
See application file for complete search history.

(56) References Cited

OTHER PUBLICATIONS

Torrieri, D.; "Algorithms for finding an optimal set of short disjoint paths in a communication network", IEEE Transactions on Communications, vol. 40, Issue 11, Nov. 1992.*
E. Clarke, Jr. et al; "Model Checking"; Chapter 1, MIT Press, 1999, pp. 4-6.
K. McMillan; "Symbolic Model Checking", Kluwer Academic Publishers, Chapter 2, pp. 11-12; 1993.
E. M. Clarke et al; "Efficient Generation of Counterexamples and Witnesses in Symbolic Model Checking"; 32$^{nd}$ Design Automation Conference, 1995, pp. 427-432.
Beer et al; "RuleBase: an Industry-Oriented Formal Verification Tool"; Proceedings of the Design Automation Conference DAC '96; 1996.
Beer et al; "On-the-fly Model Checking of RCTL Formulas"; Proceedings of the Tenth International Conference on Computer Aided Verification (CAV 1998).
Beer et al; "The Temporal Logic Sugar"; Proceedings of the Thirteenth International Conference on Computer Aided Verification (CAV 2001).
Bryant; "Graph-based Algorithms for Boolean Function Manipulation", IEEE Transactions on Computers C-35:8 (1986).

* cited by examiner

*Primary Examiner*—Paul L. Rodriguez
*Assistant Examiner*—Russ Guill
(74) *Attorney, Agent, or Firm*—Browdy and Neimark, PLLC

(57) ABSTRACT

A method for checking a model, which defines states of a system under study and a transition relation among the states. The method includes specifying a property that applies to a target set that comprises at least one target state among the states of the system under study. Beginning from an initial set of at least one initial state among the states of the system, successive reachable sets are computed, including the states of the system that are reachable from the initial set, until an intersection is found between one of the reachable sets and the target set. A plurality of mutually-disjoint traces are then computed from the at least one target state in the intersection through the states in the reachable sets to the at least one initial state.

30 Claims, 5 Drawing Sheets

EFFICIENT PRODUCTION OF DISJOINT MULTIPLE TRACES

CROSS-REFERENCE TO RELATED APPLICATIONS

This application claims the benefit of U.S. Provisional Patent Application No. 60/261,550, filed Jan. 12, 2001. It is related to U.S. patent application Ser. No. 09/367,720, filed Jul. 29, 1999, as well as to another U.S. patent application, filed on even date, entitled "Time-Memory Tradeoff Control in Counterexample Production." All of these related applications are assigned to the assignee of the present patent application and are incorporated herein by reference.

FIELD OF THE INVENTION

The present invention relates generally to design automation and verification, and specifically to design exploration based on symbolic model checking.

BACKGROUND OF THE INVENTION

Model checking is a method of formal verification that is gaining in popularity as a tool for use in designing complex systems, such as integrated circuits. The method is described generally by Clarke et al. in *Model Checking* (MIT Press, 1999), which is incorporated herein by reference.

To perform model checking of the design of a device, a user reads the definition and functional specifications of the device and then, based on this information, writes a set of properties $\{\phi\}$ (also known as a specification) that the design is expected to fulfill. The properties are written in a suitable specification language for expressing temporal logic relationships between the inputs and outputs of the device. Such languages are commonly based on Computation Tree Logic (CTL). A hardware model M (also known as an implementation) of the design, which is typically written in a hardware description language, such as VHDL or Verilog, is then tested to ascertain that the model satisfies all of the properties in the set, i.e., that $M \models \phi$, under all relevant input sequences. Such testing is a form of reachability analysis.

One of the most useful features of model checking is its ability, when a property $\phi$ is found to be false on M, to construct a sequence of states and transitions (a path) that leads to the problematic state of the design. This path is called a counterexample. It can be used by the engineer in understanding and remedying the design defect that led to the failure of the model.

Model checking is preferably carried out automatically by a symbolic model checking program, such as SMV, as described, for example, by McMillan in *Symbolic Model Checking* (Kluwer Academic Publishers, 1993), which is incorporated herein by reference. A number of practical model checking tools are available, among them RuleBase, developed by IBM Corporation. This tool is described by Beer et al. in "RuleBase: an Industry-Oriented Formal Verification Tool," in *Proceedings of the Design Automation Conference DAC'96* (Las Vegas, Nev., 1996), which is incorporated herein by reference.

Symbolic CTL model checking as described by McMillan involves computing the transition-relation (TR) of the model, and then applying the model checking algorithm to verify a given formula. In many cases, the full TR is too big to be computed. This problem is addressed by Beer et al., in "On-the-fly Model Checking of RCTL Formulas," *Proceedings of the Tenth International Conference on Computer Aided Verification* (CAV 1998), which is incorporated here in by reference. In this paper, the authors describe a technique for solving CTL formulas of the form AG(p) on the fly, wherein p is a Boolean expression. An AG(p) formula states that p is true in every reachable state of the model. Therefore, to disprove this formula, it is sufficient to find one "bad" state in which p is false.

If S is the set of states in which p is false, then in order to find a bad state, it is necessary only to intersect S with the set of reachable states R, and check that the intersection is not empty. Finding this intersection is computationally easy, and therefore can be performed on the fly, i.e., after each iteration of the reachability analysis. If the intersection of S and R is found at any point to be non-empty, the process is stopped, and AG(p) is false. Otherwise, the process continues and terminates when the entire reachable state space has been computed, so that AG (p) is shown to be true. Thus, this method eliminates the large expenditure of computation resources needed to compute the full transition relation. Furthermore, since counterexamples are produced on the fly, only a portion of the reachable state space must be computed when the formula fails, saving even more time and memory space.

The on-the-fly model checking procedure is shown formally in Table I below:

TABLE I

ON-THE-FLY MODEL CHECKING

```
1   reachable = new = initialStates;
2   i = 0;
3   while ((new ≠ Ø) && (new ∩ p = Ø)) {
4       S_i = new;
5       i = i+1;
6       next = nextStateImage (new)
7       new = next \ reachable;
8       reachable = reachable ∪ next;
9   }
10  if (new = Ø) {
11      print "formula is true in the model";
12      return;
13  }
```

Here the "&&" operator represents logical conjunction, and the function "nextStateImage(new)" returns the states that are reached in one cycle of the system transition relation beginning from the states in {new}.

In the above-mentioned article, Beer et al. also define a specification language RCTL, as a subset of the conventional CTL language using regular expressions. RCTL makes it possible to translate many CTL formulas conveniently into state machines having an error state. Such formulas can then be verified by on-the-fly model checking of the formula AG(¬error). More recently, Beer et al. have extended RCTL to include further expressions and syntax that are useful in creating formulas for on-the-fly model checking, as described in "The Temporal Logic Sugar," *Proceedings of the Thirteenth International Conference on Computer Aided Verification* (CAV 2001), which is incorporated here in by reference.

SUMMARY OF THE INVENTION

As exemplified by Table I above, model checkers known in the art either verify that a given formula is satisfied or return a single counterexample. In preferred embodiments of the present invention, however, a model checker generates multiple traces, demonstrating two or more different ways of reaching a target state or states of interest. In order to provide the user with additional insight into the behavior of the design in question, the traces are preferably chosen to be as different from one another as possible. Most preferably, the states of the system under test are represented using binary decision diagrams (BDDs), as are known in the art, and each new trace is chosen on the BDDs so as to be as distant as possible from the preceding traces.

Preferred embodiments of the present invention can be used not only for design verification, to find traces leading to bad states of the system, but also for design exploration, as described in the above-mentioned U.S. patent application Ser. No. 09/367,720. In the exploration paradigm, instead of seeking errors in finished designs, the model checker assists the user in understanding the operation of his or her design in the development phase. The exploration tool is given a model M and a path specification P. It then applies model checking to find a set of good states, in which the specified path is shown to be true. If such a good set is found, the tool finds a "counterexample"—in this case, a trace that reaches one of the good states. The user can then analyze the trace to decide whether the model behaves as it should.

There is therefore provided, in accordance with a preferred embodiment of the present invention, a method for checking a model, which defines states of a system under study and a transition relation among the states, the method including:

specifying a property that applies to a target set that includes at least one target state among the states of the system under study;

beginning from an initial set of at least one initial state among the states of the system, computing successive reachable sets including the states of the system that are reachable from the initial set;

finding an intersection between one of the reachable sets and the target set; and computing a plurality of mutually-disjoint traces from the at least one target state in the intersection through the states in the reachable sets to the at least one initial state.

Preferably, specifying the property includes specifying a condition that is expected to be true over all of the reachable states of the system under study, and wherein the condition is false in the at least one target state. Alternatively, specifying the property includes specifying a condition representing a desired behavior of the system under study, such that the condition is fulfilled in the at least one target state.

Preferably, computing the successive reachable sets includes testing the property while computing the sets, and ceasing to compute the sets when the intersection is found.

Preferably, computing the successive reachable sets includes determining a first one of the reachable sets, disjoint from the initial set, such that all of the states in the first one of the reachable sets are reached from the at least one initial state in a first cycle of the transition relation, and determining the successive reachable sets, following the first one of the reachable sets, such that all of the states in each of the reachable sets are reached from the states in a preceding one of the reachable sets in a successive cycle of the transition relation, and so that each of the successive reachable sets is disjoint from the initial set and from the other reachable sets determined before it. Further preferably, computing the traces includes, for each trace among the multiple traces, selecting one of the states from each of the successive reachable sets. Most preferably, selecting the one of the states includes, for each of the selected states, choosing a predecessor state among the states in a preceding one of the reachable sets until the state on the trace in the first one of the reachable sets is found, and choosing the predecessor state in the initial set to the state in the first one of the reachable sets. Most preferably, choosing the predecessor state includes, on each of the traces computed after a first one of the traces, choosing the predecessor state so as to maximize a distance of the trace from the other traces already computed.

Preferably, computing the traces includes selecting the states on each trace among the multiple traces so as to maximize a distance of the trace from the other traces already computed. In a preferred embodiment, each of the states is represented by a binary decision diagrams (BDD), and selecting the states on each trace includes maximizing the distance between the BDD representing the state to be selected and the BDD representing the states on the other traces. Preferably, maximizing the distance includes taking a left trial state and a right trial state on left and right branches, respectively, of the BDD representing the state to be selected, and choosing the trial state that has a larger Hamming distance from the BDD representing the states on the other traces.

There is also provided, in accordance with a preferred embodiment of the present invention, model checking apparatus, including a model processor, which is arranged to receive a model defining states of a system under study and a transition relation among the states, and to receive a specification of a property that applies to a target set including at least one target state among the states of the system under study, the processor being further arranged to compute, beginning from an initial set of at least one initial state among the states of the system, successive reachable sets including the states of the system that are reachable from the initial set, to find an intersection between one of the reachable sets and the target set, and to compute a plurality of mutually-disjoint traces from the at least one target state in the intersection through the states in the reachable sets to the at least one initial state.

There is additionally provided, in accordance with a preferred embodiment of the present invention, a computer software product, including a computer-readable medium in which program instructions are stored, which instructions, when read by a computer, cause the computer to receive a model defining states of a system under study and a transition relation among the states, and to receive a specification of a property that applies to a target set including at least one target state among the states of the system under study, the instructions further causing the computer to compute, beginning from an initial set of at least one initial state among the states of the system, successive reachable sets including the states of the system that are reachable from the initial set, to find an intersection between one of the reachable sets and the target set, and to compute a plurality of mutually-disjoint traces from the at least one target state in the intersection through the states in the reachable sets to the at least one initial state.

The present invention will be more fully understood from the following detailed description of the preferred embodiments thereof, taken together with the drawings in which:

DETAILED DESCRIPTION OF PREFERRED EMBODIMENTS

Figure 1:
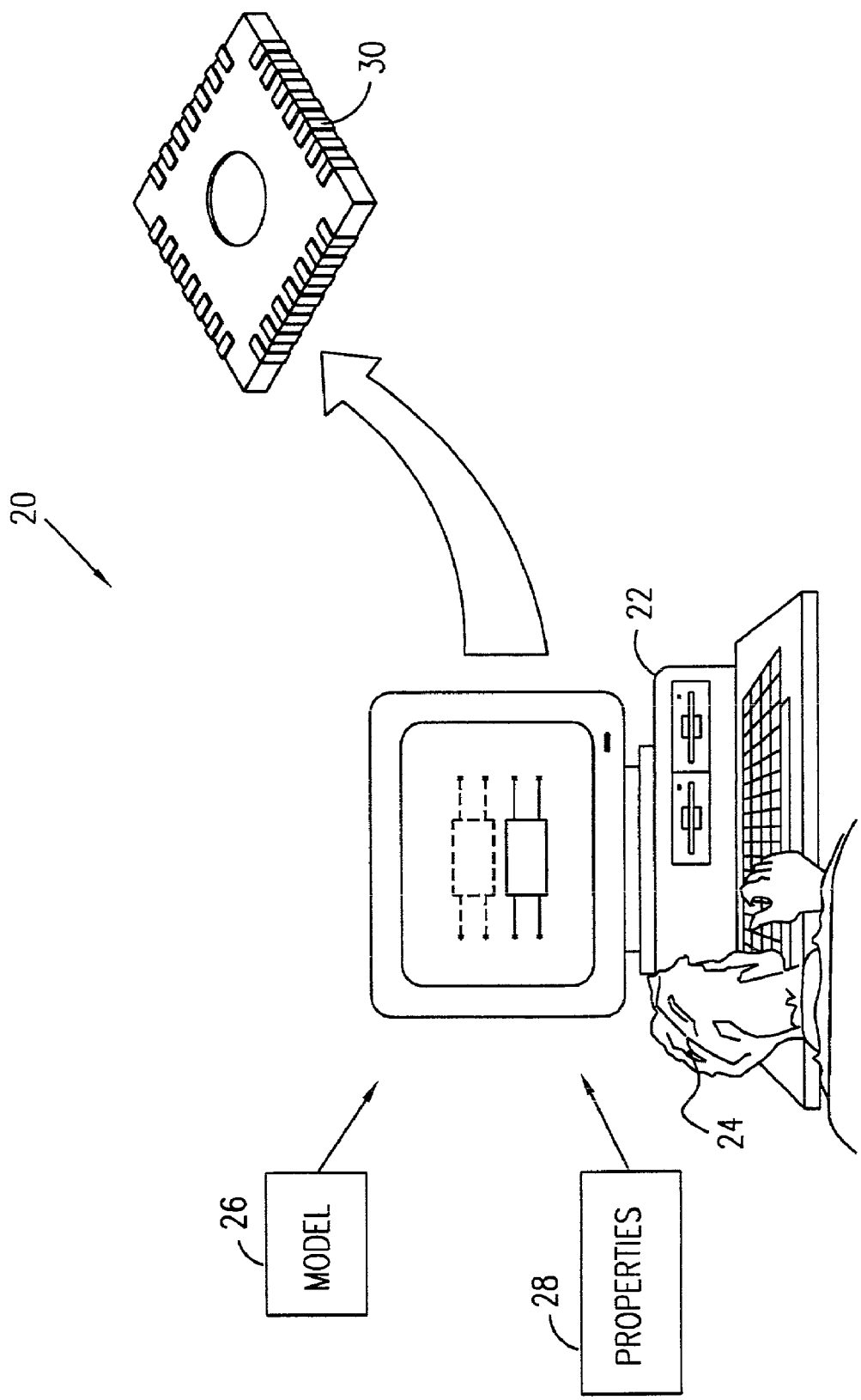
FIG. 1 is a schematic, pictorial illustration showing a system for design exploration, in accordance with a preferred embodiment of the present invention.

FIG. 1 is a schematic pictorial illustration of a system 20 for symbolic model checking, in accordance with a preferred embodiment of the present invention. System 20 typically comprises a model processor 22, typically a general-purpose computer workstation running suitable model checking software, under the control of a user 24, typically a design or verification engineer. The software may be downloaded to processor 22 in electronic form, over a network, for example, or it may be supplied on tangible media, such as CD-ROM or non-volatile memory. Processor 22 receives a hardware implementation model 26 of a target system or device 30 in development, which may refer to the entire system or device or to a sub-unit, such as a circuit or functional block. User 24 prepares a specification of properties 28 for use in model checking of model 26, and selects initial and target states of the model. System 20 analyzes the model, using methods described in detail hereinbelow, to find disjoint multiple traces between the initial and target states.

Figure 2:
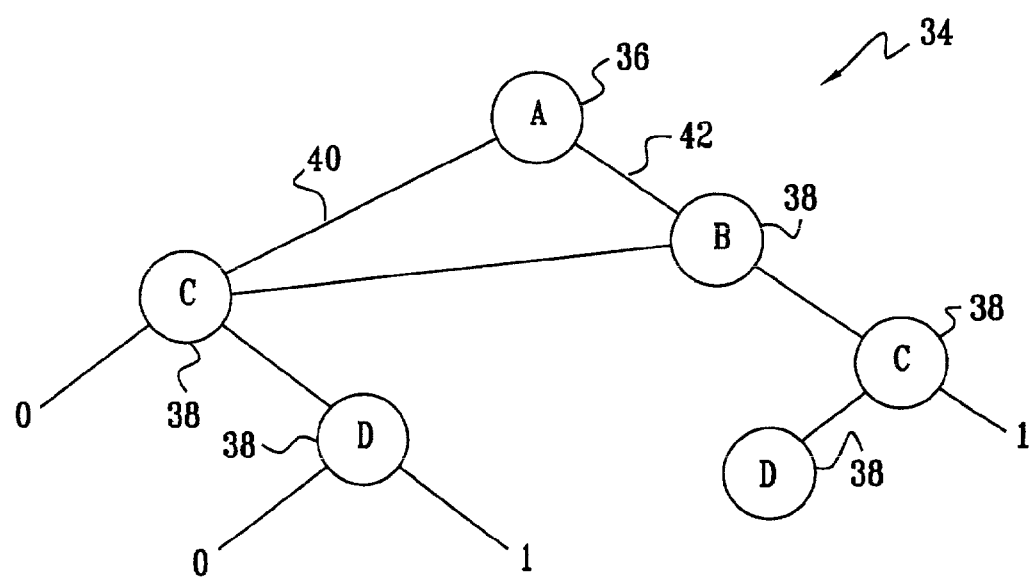
FIG. 2 is a graph that schematically illustrates a binary decision diagram (BDD)

FIG. 2 is a graph that schematically illustrates a binary decision diagram (BDD) 34, as is known in the art. BDD 34 is presented here as an aid in understanding the operation of preferred embodiments of the present invention. The theory of BDDs is described, for example, by Bryant, in "Graph-based Algorithms for Boolean Function Manipulation," *IEEE Transactions on Computers* C-35:8 (1986), which is incorporated herein by reference. BDDs are widely used in the model checking art and are useful in implementing the present invention. The principles of the present invention may also be implemented using other methods known in the art for representing state variables, however, and the present invention is in no-way limited to the BDD-based methods described hereinbelow.

BDD 34 is a directed acyclic graph representing a Boolean function, in this case $(a \land b \land c) \lor (a \land b \land \neg d) \lor (c \land d)$. The BDD comprises a plurality of nodes 36, 38, each representing one Boolean variable. Node 36 is the root node. The value of the function when the variable at a given node has the value zero is found by taking a left branch 40 from the node, while the value when the variable has the value one is found by taking a right branch 42. Thus, for example, to find the value of the function when $a=b=c=d=0$, we traverse BDD 34 starting from root node 36. Taking left branch 40 brings us to node c, and taking the left branch again brings us to a leaf with value zero. Therefore, the value of the function for $a=b=c=d=0$ is zero.

Figure 3:
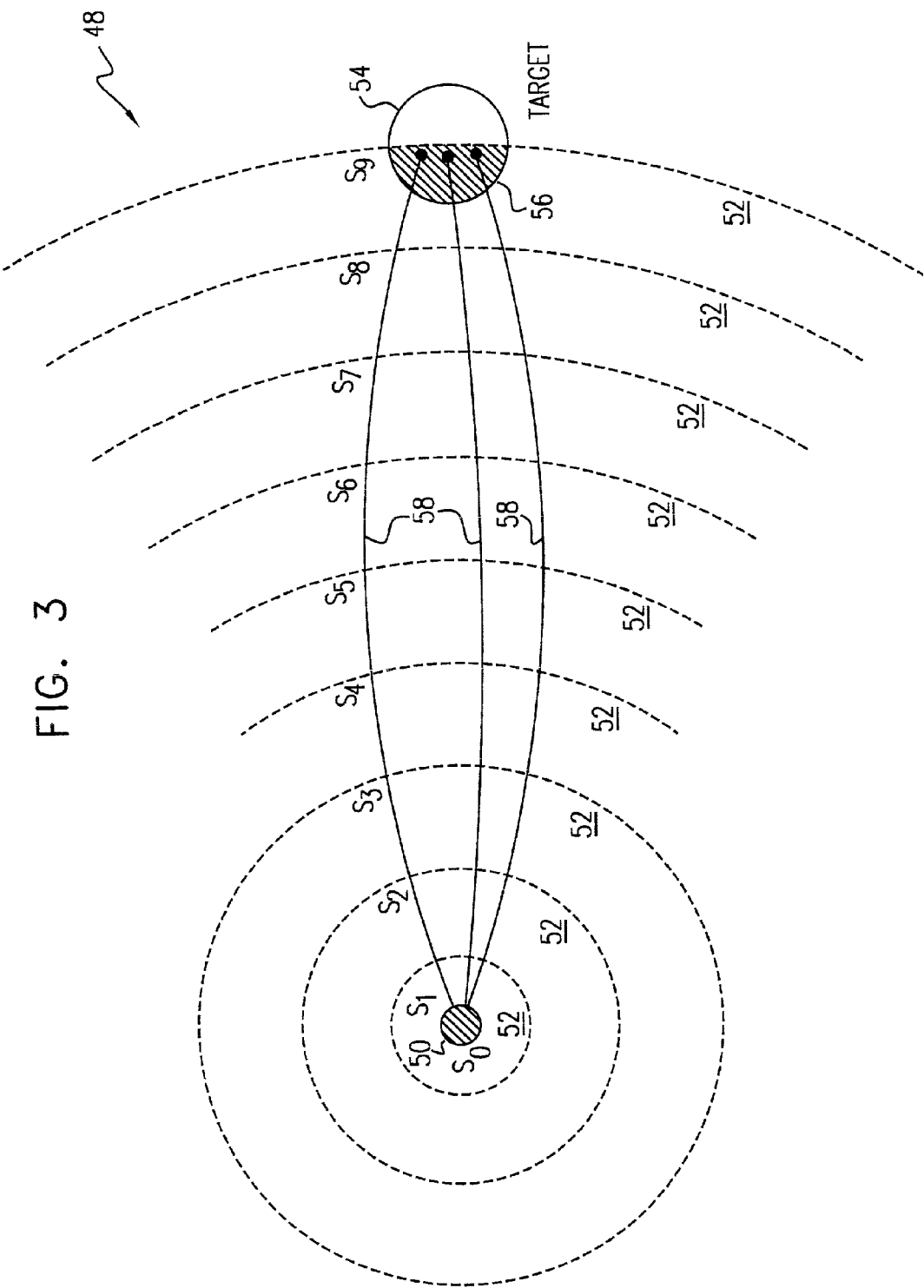
FIG. 3 is a schematic representation of a system state space, illustrating disjoint multiple paths between initial and target states, in accordance with a preferred embodiment of the present invention.
Figure 4:
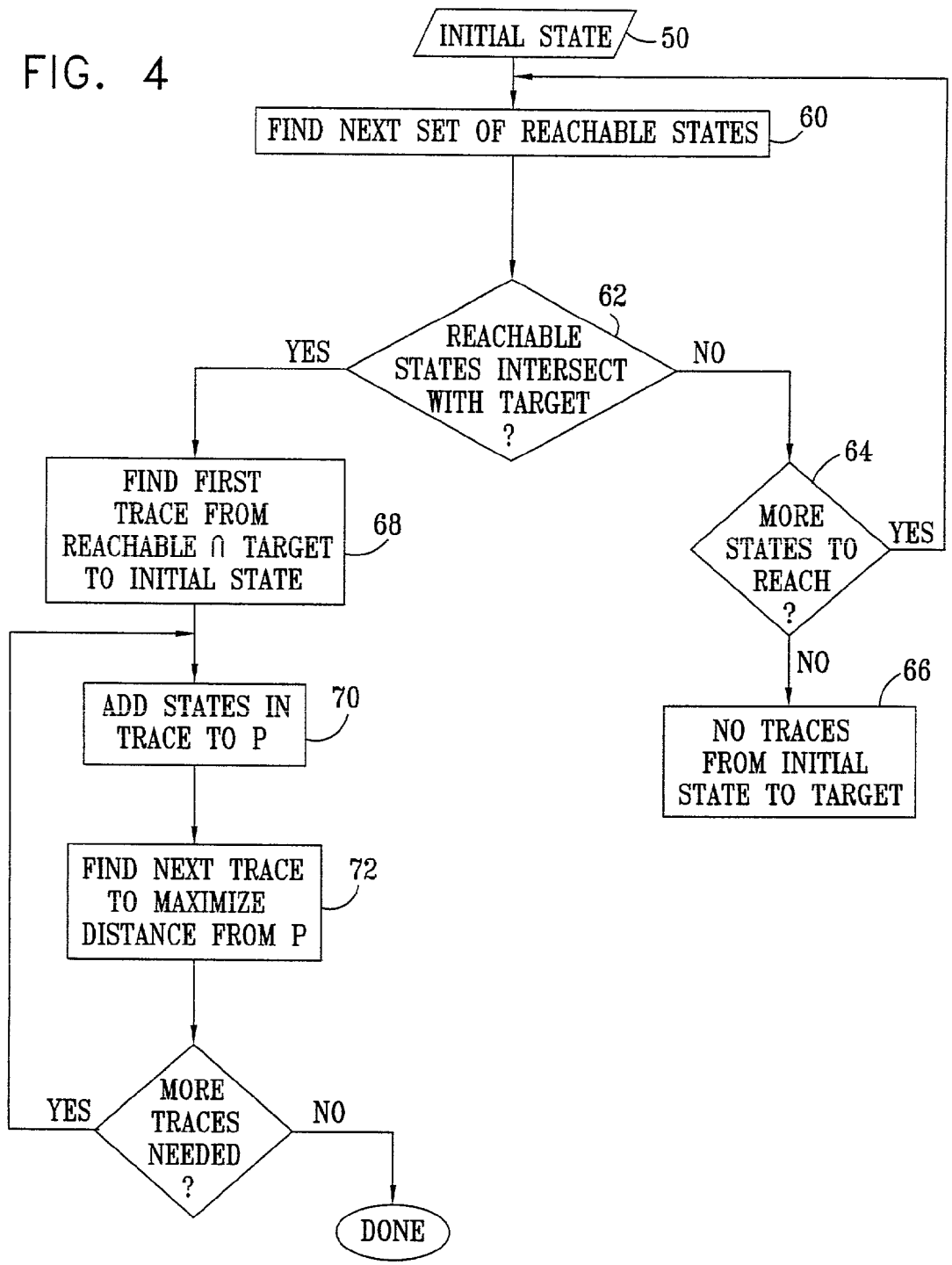
FIG. 4 is a flow chart that schematically illustrates a method for finding disjoint multiple traces in symbolic model checking, in accordance with a preferred embodiment of the present invention.

Reference is now made to FIGS. 3 and 4, which illustrate a method for finding disjoint multiple counterexample traces, in accordance with a preferred embodiment of the present invention. FIG. 3 is a schematic representation of a state space 48 of model 26, providing a conceptual view of the operation of the method. FIG. 4 is a flow chart that schematically illustrates the method itself. Design exploration begins from a set 50 of initial states, labeled $S_0$, which are typically specified by user 24. At an iteration step 60, processor 22 applies an image operation (using the nextStateImage( ) function at line 6 in Table I) to map $S_0$ into a "donut" 52 of states $S_1$. Subsequent iterations map each donut $S_J$ into a successive donut $S_{J+1}$. Referring back to Table I, at line 7, states reached previously are removed from the set included in the new donut, so that each donut is uniquely characterized by the minimal number J of iterations of the transition relation that are required to reach the states in the donut.

For simplicity, it is assumed here that all of the donuts are saved as the iterations through step 60 proceed. When large numbers of states are involved, however, saving all of these donuts can be excessively costly in terms of memory requirements. Therefore, in many cases it is preferable to save the donuts only intermittently (say one donut in every N successive donuts), and then to recompute the donuts subsequently when they are needed for finding counterexample traces. This method of memory conservation is described further in the above-mentioned patent application entitled "Time-Memory Tradeoff Control in Counterexample Production."

As each new donut 52 is computed, it is checked against a definition of target states 54, at an intersection checking step 62 (corresponding to line 3 in Table I). As noted above, the target states are typically characterized by a predefined formula AG(p) (or ¬p) being false on these states. As long as no intersection is found, processor 22 checks to determine whether the entire reachable state space of the model has been explored, at a state exhaustion step 64. If there are no more states to reach, processor 22 reports that the formula AG(p) is true on model 56 (line 11 in Table I), and returns no counterexample traces, at a traceless return step 66. Otherwise, the processor iterates again through step 60 to find the next donut, and the process is repeated.

When an intersection region 56 is found between target states 54 and one of donuts 52 ($S_9$ in the example of FIG. 3), processor 22 proceeds to find a counterexample trace 58, at a first trace finding step 68. Methods for finding a single counterexample are well known in the art. Table II below lists an exemplary method, which begins following line 13 in the listing of Table I:

TABLE II

| | FINDING A COUNTEREXAMPLE |
|---|---|
| 14 | k = i; |
| 15 | print "formula is false in the model, failed at cycle k"; |
| 16 | bad = new ∩ error; |
| 17 | while (i≧0) { |
| 18 | $Ce_i$ = choose one state from bad; |
| 19 | if (i>0) bad = pred ($Ce_i$) ∩ $S_{i-1}$; |
| 20 | i = i-1; |
| 21 | } |
| 22 | print "first counter example is:" $Ce_0$ . . . $Ce_k$; |

Here the function "pred($Ce_i$)" finds, for each "bad" state along the trace, a predecessor state in the preceding donut that would be mapped to the bad state by the image operation described above. The set of predecessor states $Ce_0$ . . . $Ce_k$ from initial states 50 to intersection region 56 constitutes a counterexample trace.

Whereas methods of model checking known in the art stop at this point, in preferred embodiments of the present invention, processor 22 continues to find additional counterexample traces. The states on each new trace are preferably chosen so as to maximize a distance between the states on the new trace from those on the previous trace or traces, as described in detail hereinbelow. Alternatively, the states on each new trace could be chosen at random, although this choice might lead to the traces being bunched in a certain part of state space 48, thus affording less insight to user 24. Both of these alternative criteria differ from methods of constructing counterexamples known in the art, in which for a given BDD ordering of the system variables, the choice of candidate states is deterministic.

Returning to the method of FIG. 4, in order to find traces that range over as much of the relevant state space as possible, the states in each trace that is found are collected in a set P, at a state collection step 70. Then, each new trace is constructed, at a next trace step 72, in such a way as to maximize a distance between each new state in the new trace and the states in P. This procedure continues until the desired number of traces have been generated.

Figure 5:
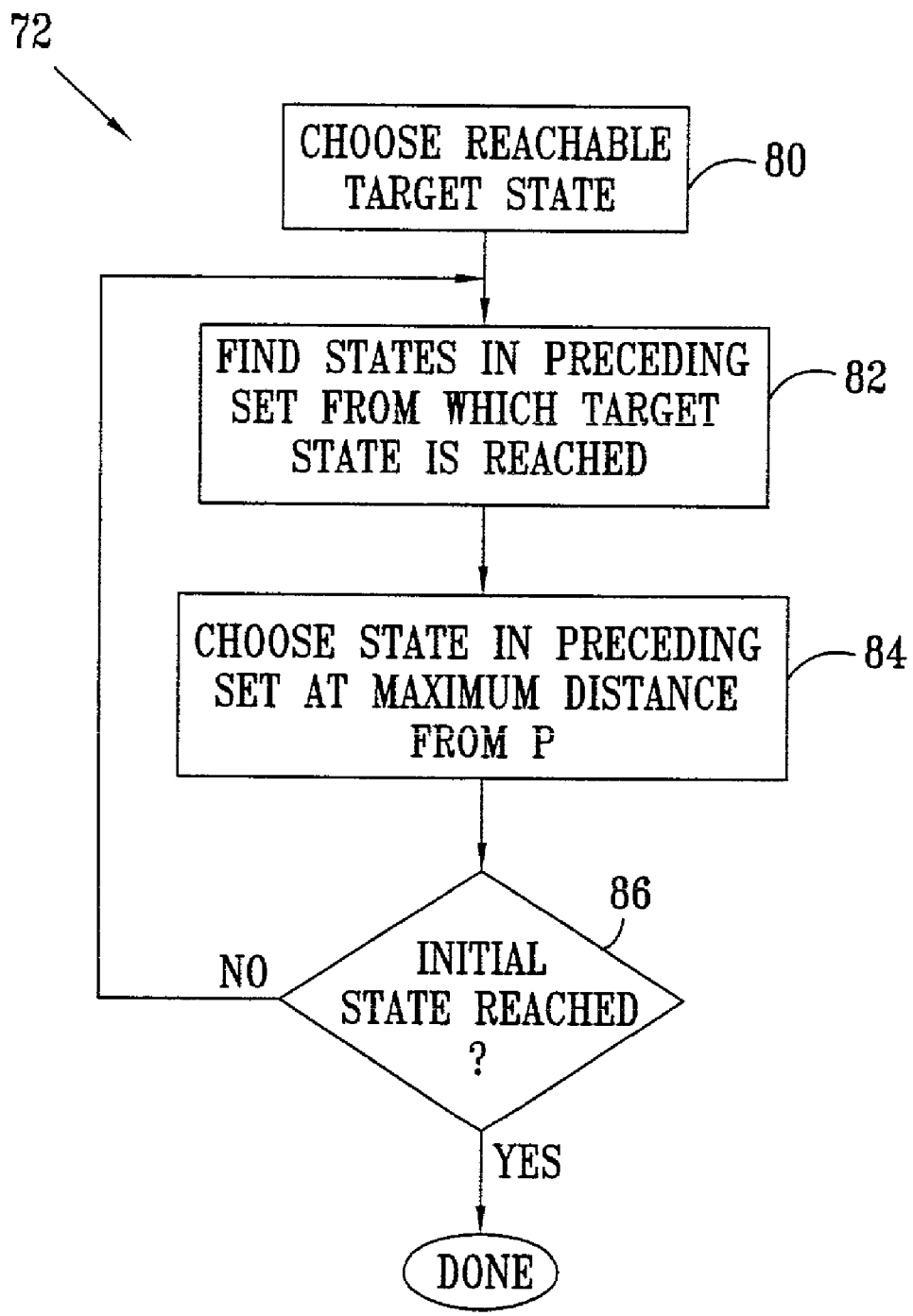
FIG. 5 is a flow chart that schematically illustrates a method for finding a trace in symbolic model checking that is distant from other traces previously found in model checking of the same system, in accordance with a preferred embodiment of the present invention.

FIG. 5 is a flow chart that schematically shows details of constructing one of traces 58 at next trace step 72, in accordance with a preferred embodiment of the present invention. This step corresponds roughly to the loop of lines 17–20 in Table II. The method begins with selection of a reachable target state, i.e., a state in intersection region 56, at a target choice step 80. Processor 22 evaluates a set of candidate predecessor states, at a predecessor finding step 82. These are the states in the previous donut $S_{J-1}$ from which the current state is reachable. The states in the previous donut may simply be recalled from memory for this purpose, based on the donut of states identified previously at step 60, or the donut may be reconstructed if it was not saved.

Processor 22 chooses a state from the previous donut $S_{J-1}$ for addition to the path, at a state selection step 84. The new state is chosen so as to maximize its distance from the states in the set of states P on the paths chosen earlier. Preferably, the distance is defined as the average of a Hamming distance between the chosen state and each of the states in P, which are maintained in the form of a BDD. A preferred method for finding the state at maximum distance from P is listed in Table III below. The processor checks, at a completion checking step 86, whether the path has reached a state in $S_0$. If so, the trace is complete, and the procedure terminates. Otherwise, iteration continues through steps 82 and 84, as described above.

Table III presents a procedure for finding a state s in a set of states Q that is as far as possible from the states in a given set P. Preferably, a reduced, ordered BDD representation of P and Q is used, as is known in the art, in which the variables in each BDD have an order that does not change in the course of computations. Based on this order, each variable belongs to a level in the BDD, which increases monotonically from the root up to the leaves. The procedure of Table III uses a function find_diff_state(P,Q) to operate recursively on the BDD representations of P and Q. The function compares the levels of P and Q at each iteration, and branches depending on the relative levels. In this manner, the procedure recursively builds an output state having the form of a "shoestring," with exactly one non-zero descendent at each level. The recursion begins from the root of the BDD, and works up through the levels to the leaves. At each level, the above function checks which branch will give the more distant state and returns a "suffix" of a state that includes the current level. Upon reaching the leaves, the recursion stops.

Thus, at each iteration, if level(Q)<level(P), we find states $state_0$ and $state_1$ on the left and right branches of Q, respectively, compare their distances $dist_0$ and $dist_1$ from P, and choose the state that is the more distant. The chosen state is returned, extended by the current level of Q. If level(Q)>level(P), we find states $state_0$ and $state_1$ in Q that are respectively far from the left and right branches of P, and return the chosen state as before, this time extended by the level of P.

If the levels of P and Q are equal, a new BDD PP is computed using the or_bdd operator, which returns the disjunction of the left and right branches of P: PP=(P→left)∧(P→right). We then recursively find states in Q→left and Q→right that are distant from PP, and choose the more distant of the two states. If both of these Q states are in PP (i.e., at zero distance), we find a state in Q→left that is far from P→left, and another state in Q→right that is far from P→right, and choose the more distant of these two states. When the new trace 58 has been completely defined in this manner, the corresponding state s is added to P by disjunction of the corresponding BDDs.

TABLE III

SELECTION OF DISTANT STATE

```
1    function find_diff_state (P,Q) {
2      if (isleaf (P) && isleaf (Q) {
3        if (P = ZERO) && (Q = ONE) {
4          return (ONE, 1);
5        else
6          return (ZERO, 0);
7      }
8    }
9    if (level (Q) < level (P)) {
10     (state_0, dist_0) = find_diff_state (P,Q → left);
11     (state_1, dist_1) = find_diff_state (P,Q → right);
12     if (dist_0 > dist_1)
13       return (new_bdd (level (Q), state_0, ZERO), dist_0);
14     else
15       return (new_bdd (level (Q), ZERO, state_1), dist_1);
16   }
17   }
18   if (level (Q) > level (P)) {
19     (state_0, dist_0) = find_diff_state (P → left, Q);
20     if dist_0 > 0 dist_0 ++;
21     (state_1, dist_1) = find_diff_state (P → right, Q);
22     if dist_1 > 0 dist_1 ++;
23     if (dist_0 > dist_1) {
24       return (new_bdd (level (P) , state_0, ZERO), dist_0 );
25     else
26       return (new_bdd (level (P), ZERO, state_1), dist_1);
27   }
28   }
29   if (level (Q) = level(P)) {
30     PP = or_bdd (P → left, P → right);
31     (state_0, dist_0) = find_diff_state (PP, Q → left);
32     (state_1, dist_1) = find_diff_state (PP, Q → right);
33     if (dist_0 = 0 and dist_1 = 0) {
34       (state_0, dist_0) = find_diff_state (P → left, Q → left);
35       (state_1, dist_1) = find_diff_state (P→ right, Q→ right);
36     }
37     if (dist_0 > dist_1) {
38       return (new_bdd (level (P), state_0, ZERO), dist_0);
39     else
40       return (new_bdd (level (P), ZERO, state_1), dist_1);
41   }
42   }
43   }
```

Although the preferred embodiments described hereinabove make use of on-the-fly model checking (and are thus limited to testing formulas of the type AG(p)), the implementation of the present invention is in no way limited to this context. The principles of the present invention may be applied to find disjoint multiple traces in the state space of substantially any model that can be defined in terms of CTL formulas. It will thus be appreciated that the preferred embodiments described above are cited by way of example, and that the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

The invention claimed is:

1. A method for checking a model, which defines states of a system under study and a transition relation among the states, the method comprising:
    specifying a property that applies to a target set that comprises at least one target state among the states of the system under study;
    beginning from an initial set of at least one initial state among the states of the system, computing successive reachable sets comprising the states of the system that are reachable from the initial set;
    finding an intersection between one of the reachable sets and the target set;
    computing a plurality of mutually-disjoint traces from the at least one target state in the intersection through the states in the reachable sets to the at least one initial state, wherein the plurality of mutually-disjoint traces comprises at least one initial trace and at least one subsequently-computed trace;
    selecting the states on each subsequently-computed trace so as to maximize a distance of the subsequently-computed trace from at least the at least one initial trace; and
    using the computed traces for checking the model.

2. A method according to claim 1, wherein specifying the property comprises specifying a condition that is expected to be true over all of the reachable states of the system under study, and wherein the condition is false in the at least one target state.

3. A method according to claim 1, wherein specifying the property comprises specifying a condition representing a desired behavior of the system under study, such that the condition is fulfilled in the at least one target state.

4. A method according to claim 1, wherein computing the successive reachable sets comprises testing the property while computing the successive reachable sets, and ceasing to compute the successive reachable sets when the intersection is found.

5. A method according to claim 1, wherein computing the successive reachable sets comprises:
    determining a first one of the reachable sets, disjoint from the initial set, such that all of the states in the first one of the reachable sets are reached from the at least one initial state in a first cycle of the transition relation; and
    determining the successive reachable sets, following the first one of the reachable sets, such that all of the states in each of the reachable sets are reached from the states in a preceding one of the reachable sets in a successive cycle of the transition relation, and so that each of the successive reachable sets is disjoint from the initial set and from the other reachable sets determined before it.

6. A method according to claim 5, wherein computing the traces comprises, for each trace among the plurality mutually-disjoint traces, selecting one of the states from each of the successive reachable sets.

7. A method according to claim 6, wherein selecting the one of the states comprises, for each of the states that is selected, choosing a predecessor state among the states in a preceding one of the reachable sets until the state on the trace in the first one of the reachable sets is found, and choosing the predecessor state in the initial set to be the state in the first one of the reachable sets.

8. A method according to claim 7, wherein choosing the predecessor state comprises, on each of the traces computed after a first one of the traces, choosing the predecessor state so as to maximize a distance of the trace from the other traces already computed.

9. A method according to claim 1, wherein each of the states is represented by a binary decision diagram (BDD), and wherein selecting the states on each trace comprises maximizing the distance between the BDD representing the state to be selected and the BDD representing the states on the other traces already computed.

10. A method according to claim 9, wherein maximizing the distance comprises:
    taking a left trial state and a right trial state on left and right branches, respectively, of the BDD representing the state to be selected; and
    choosing the trial state that has a larger Hamming distance from the BDD representing the states on the other traces.

11. Model checking apparatus, comprising a model processor, which is arranged to receive a model defining states of a system under study and a transition relation among the states, and to receive a specification of a property that applies to a target set comprising at least one target state among the states of the system under study, the processor being further arranged to compute, beginning from an initial set of at least one initial state among the states of the system, successive reachable sets comprising the states of the system that are reachable from the initial set, to find an intersection between one of the reachable sets and the target set, and to compute, for use in checking the model, a plurality of mutually-disjoint traces from the at least one target state in the intersection through the states in the reachable sets to the at least one initial state, wherein the plurality of mutually-disjoint traces comprises at least one initial trace and at least one subsequently-computed trace, and wherein the states on each subsequently-computed trace are selected so as to maximize a distance of the subsequently-computed trace from at least the at least one initial trace.

12. Apparatus according to claim 11, wherein the property comprises a condition that is expected to be true over all of the reachable states of the system under study, and wherein the condition is false in the at least one target state.

13. Apparatus according to claim 11, wherein the property comprises a condition representing a desired behavior of the system under study, such that the condition is fulfilled in the at least one target state.

14. Apparatus according to claim 11, wherein the processor is arranged to test the property while computing the successive reachable sets, and ceases to compute the successive reachable sets when the intersection is found.

15. Apparatus according to claim 11, wherein the processor is arranged to compute a first one of the reachable sets, disjoint from the initial set, such that all of the states in the first one of the reachable sets are reached from the at least one initial state in a first cycle of the transition relation, and further to compute the successive reachable sets, following the first one of the reachable sets, such that all of the states in each of the reachable sets are reached from the states in a preceding one of the reachable sets in a successive cycle of the transition relation, and so that each of the successive reachable sets is disjoint from the initial set and from the other reachable sets determined before it.

16. Apparatus according to claim 15, wherein the processor is arranged to compute the traces by selecting, for each trace among the plurality of mutually-disjoint traces, one of the states from each of the successive reachable sets.

17. Apparatus according to claim 16, wherein the processor is arranged to compute the traces by choosing, for each of the selected states, a predecessor state among the states in a preceding one of the reachable sets until the state on the trace in the first one of the reachable sets is found, and choosing the predecessor state in the initial set to be the state in the first one of the reachable sets.

18. Apparatus according to claim 17, wherein the processor is arranged to choose the predecessor state on each of the traces computed after a first one of the traces so as to maximize the distance of the trace from the other traces already computed.

19. Apparatus according to claim 11, wherein each of the states is represented by a binary decision diagram (BDD), and wherein the processor is arranged to select the states on each trace so as to maximize the distance between the BDD representing the state to be selected and the BDD representing the states on the other traces already computed.

20. Apparatus according to claim 19, wherein the processor is arranged to maximize the distance by taking a left trial state and a right trial state on left and right branches, respectively, of the BDD representing the state to be selected, and choosing the trial state that has a larger Hamming distance from the BDD representing the states on the other traces.

21. A computer software product, comprising a computer-readable medium in which program instructions are stored, which instructions, when read by a computer, cause the computer to receive a model defining states of a system under study and a transition relation among the states, and to receive a specification of a property that applies to a target set comprising at least one target state among the states of the system under study, the instructions further causing the computer to compute, beginning from an initial set of at least one initial state among the states of the system, successive reachable sets comprising the states of the system that are reachable from the initial set, to find an intersection between one of the reachable sets and the target set, and to compute, for use in checking the model, a plurality of mutually-disjoint traces from the at least one target state in the intersection through the states in the reachable sets to the at least one initial state, wherein the plurality of mutually-disjoint traces comprises at least one initial trace and at least one subsequently-computed trace, and wherein the states on each subsequently-computed trace are selected so as to maximize a distance of the subsequently-computed trace from at least the at least one initial trace.

22. A product according to claim 21, wherein the property comprises a condition that is expected to be true over all of the reachable states of the system under study, and wherein the condition is false in the at least one target state.

23. A product according to claim 21, wherein the property comprises a condition representing a desired behavior of the system under study, such that the condition is fulfilled in the at least one target state.

24. A product according to claim 21, wherein the instructions cause the computer to test the property while computing the successive reachable sets, and to cease to compute the successive reachable sets when the intersection is found.

25. A product according to claim 21, wherein the instructions cause the computer to compute a first one of the reachable sets, disjoint from the initial set, such that all of the states in the first one of the reachable sets are reached from the at least one initial state in a first cycle of the transition relation, and further to compute the successive reachable sets, following the first one of the reachable sets, such that all of the states in each of the reachable sets are reached from the states in a preceding one of the reachable sets in a successive cycle of the transition relation, and so that each of the successive reachable sets is disjoint from the initial set and from the other reachable sets determined before it.

26. A product according to claim 25, wherein the instructions cause the computer to compute the traces by selecting, for each trace among the plurality of mutually-disjoint traces, one of the states from each of the successive reachable sets.

27. A product according to claim 26, wherein the instructions cause the computer to compute the traces by choosing, for each of the selected states, a predecessor state among the states in a preceding one of the reachable sets until the state on the trace in the first one of the reachable sets is found, and choosing the predecessor state in the initial set to be the state in the first one of the reachable sets.

28. A product according to claim 27, wherein the instructions cause the computer to choose the predecessor state on each of the traces computed after a first one of the traces so as to maximize the distance of the trace from the other traces already computed.

29. A product according to claim 21, wherein each of the states is represented by a binary decision diagram (BDD), and wherein the instructions cause the computer to select the states on each trace so as to maximize the distance between the BDD representing the state to be selected and the BDD representing the states on the other traces already computed.

30. A product according to claim 29, wherein the instructions cause the computer to maximize the distance by taking a left trial state and a right trial state on left and right branches, respectively, of the BDD representing the state to be selected, and choosing the trial state that has a larger Hamming distance from the BDD representing the states on the other traces.

* * * * *